(12) United States Patent
Chen et al.

(10) Patent No.: US 10,854,951 B2
(45) Date of Patent: Dec. 1, 2020

(54) ANTENNA PACKAGE STRUCTURE AND ANTENNA PACKAGING METHOD

(71) Applicant: SJ Semiconductor(Jiangyin) Corporation, Jiangyin (CN)

(72) Inventors: Yenheng Chen, Jiangyin (CN); Chengchung Lin, Jiangyin (CN); Chengtar Wu, Jiangyin (CN); Jangshen Lin, Jiangyin (CN)

(73) Assignee: SJ Semiconductor (Jiangyin) Corporation, JiangYin (CN)

( * ) Notice: Subject to any disclaimer, the term of this patent is extended or adjusted under 35 U.S.C. 154(b) by 0 days.

(21) Appl. No.: 16/353,990

(22) Filed: Mar. 14, 2019

(65) Prior Publication Data
US 2019/0288372 A1    Sep. 19, 2019

(30) Foreign Application Priority Data

Mar. 16, 2018   (CN) .................. 2018 1 02175704
Mar. 16, 2018   (CN) .................. 2018 2 03593267 U

(51) Int. Cl.
| | |
|---|---|
| *H01L 23/48* | (2006.01) |
| *H01Q 1/22* | (2006.01) |
| *H01Q 21/00* | (2006.01) |
| *H01Q 9/04* | (2006.01) |
| *H01Q 21/06* | (2006.01) |
| *H01L 23/522* | (2006.01) |
| *H01L 23/00* | (2006.01) |
| *H01L 23/66* | (2006.01) |

(52) U.S. Cl.
CPC ....... *H01Q 1/2283* (2013.01); *H01L 23/5226* (2013.01); *H01L 23/66* (2013.01); *H01L 24/17* (2013.01); *H01L 24/81* (2013.01); *H01Q 9/0421* (2013.01); *H01Q 21/0087* (2013.01); *H01Q 21/065* (2013.01); *H01L 2223/6677* (2013.01); *H01L 2924/014* (2013.01)

(58) Field of Classification Search
CPC ............. H01Q 1/2283; H01Q 21/0087; H01Q 21/065; H01L 23/66; H01L 2223/6677; H01L 21/486
USPC .................................................. 257/728, 774
See application file for complete search history.

(56) References Cited

U.S. PATENT DOCUMENTS

| | | | | |
|---|---|---|---|---|
| 9,984,992 | B2* | 5/2018 | DeLaCruz | H05K 1/0284 |
| 2006/0049995 | A1* | 3/2006 | Imaoka | H01Q 1/2283 |
| | | | | 343/702 |
| 2018/0158787 | A1* | 6/2018 | Chang | H01L 23/552 |
| 2018/0358312 | A1* | 12/2018 | Yu | H01L 21/4857 |
| 2019/0019756 | A1* | 1/2019 | Yu | H01L 23/5226 |
| 2019/0035749 | A1* | 1/2019 | Dalmia | H01L 24/09 |
| 2019/0096828 | A1* | 3/2019 | Wu | H01L 23/5384 |
| 2019/0137208 | A1* | 5/2019 | Messinger | F41G 1/38 |
| 2019/0173195 | A1* | 6/2019 | Kim | H01Q 21/065 |

(Continued)

*Primary Examiner* — Nitin Parekh
(74) *Attorney, Agent, or Firm* — Alston & Bird LLP

(57) ABSTRACT

The present disclosure provides an antenna package structure and an antenna packaging method for a semiconductor chip. The package structure includes an antenna circuit chip, a first rewiring layer, an antenna structure, a second metal connecting column, a second packaging layer, a second antenna metal layer, and a second metal bump. The antenna circuit chip, the antenna structure, and the second antenna metal layer are interconnected by using two rewiring layers and two layers of metal connecting columns.

11 Claims, 5 Drawing Sheets

(56) References Cited

U.S. PATENT DOCUMENTS

2019/0189572 A1* 6/2019 Chiang ............... H01L 23/3128
2019/0333882 A1* 10/2019 Kamgaing ........ H01L 23/49822

* cited by examiner

ANTENNA PACKAGE STRUCTURE AND ANTENNA PACKAGING METHOD

CROSS REFERENCES TO RELATED APPLICATIONS

This application claims the benefit of priority to Chinese Patent Application No. CN2018102175704, entitled "Antenna Package Structure and Antenna Packaging Method", filed with SIPO on Mar. 16, 2018, and Chinese Patent Application No. CN2018203593267, entitled "Antenna Package Structure", filed with SIPO on Mar. 16, 2018, the contents of which are incorporated herein by reference in its entirety.

TECHNICAL FIELD

The present disclosure relates to the technical field of semiconductor packaging, and in particular, to an antenna package structure and an antenna packaging method.

BACKGROUND

Various high-tech electronic products have been developed to bring convenience to users, including various electronic devices such as laptops, mobile phones, and portable Android devices (PAD), etc.

Increased demands for these popular high-tech electronic products have enabled more functions and applications configured into these high-tech products. In addition, to meet the need for mobilization, the function of wireless communication is provided. Thus, users can access the high-tech electronic devices with the function of wireless communication anywhere or any time. This greatly increases the flexibility and convenience in use of these high-tech electronic products. Therefore, users no longer have to be confined to a certain area, and can enjoy the convenience brought by these electronic products.

In general, existing antenna structures in IC devices usually have many types, for examples, they are dipole antenna, monopole antenna, patch antenna, planar inverted-F antenna, meander line antenna, inverted-L antenna, loop antenna, spiral antenna and spring antenna. A known practice is to manufacture an antenna directly on the surface of a circuit board. By this practice, an antenna occupies an extra space of the circuit board, thereby resulting in a low integration level. For various electronic devices, a large circuit board means a large size. However, the main purpose of designing and developing these electronic devices is to allow users to carry them easily. Therefore, how to reduce the area of the circuit board occupied by an antenna, and improve the integration performance of an antenna packaging structure is the key to solve the problems of these electronic devices.

In addition, an existing antenna package has typically a single-layer structure, but this structure has with low antenna efficiency, and cannot meet the increasing demand for antenna performance.

Based on the above, it is necessary to provide a packaging structure and packaging method for an antenna with a high integration level and high efficiency.

SUMMARY

The present disclosure provides an antenna package structure. The package structure comprises: a first rewiring layer, where the first rewiring layer comprises a first surface connected to the first packaging layer and a second surface opposite to the first surface; an antenna structure, comprising a first packaging layer, a first antenna metal layer, a second rewiring layer, and a first metal bump, where the first antenna metal layer is disposed on a first surface of the first packaging layer, the second rewiring layer is disposed on a second surface of the first packaging layer, the first antenna metal layer is electrically connected to the second rewiring layer by a first metal connecting column passing through the first packaging layer, the first metal bump is formed on the second rewiring layer, and bonded to the second surface of the first rewiring layer; a second metal connecting column, formed on the second surface of the first rewiring layer, where the second metal connecting column is not lower than a top surface of the antenna structure; a second packaging layer, wrapping the antenna structure and the second metal connecting column, where the second metal connecting column is exposed from a top surface of the second packaging layer; a second antenna metal layer, formed on the top surface of the second packaging layer, where the second antenna metal layer is connected to the second metal connecting column; an antenna circuit chip, bonded to the first surface of the first rewiring layer; and a second metal bump, formed on the first surface of the first rewiring layer, to achieve electrical lead-out of the first rewiring layer.

Preferably, the material of the first packaging layer comprises one of polyimide (PI), silica gel, and epoxy resin, and the material of the second packaging layer comprises one of PI, silica gel, and epoxy resin.

Preferably, the first rewiring layer comprises a patterned dielectric layer and a patterned metal wiring layer.

Preferably, the second rewiring layer comprises a first patterned dielectric layer, a patterned metal wiring layer, and a second patterned dielectric layer which are sequentially stacked, and the first metal bump passes through the patterned second dielectric layer and is connected to the patterned metal wiring layer.

Preferably, the material of the dielectric layer comprises one or a combination of epoxy resin, silica gel, PI, PBO, BCB, silica, phosphosilicate glass, and fluorine-containing glass, and the material of the metal wiring layer comprises one or a combination of copper, aluminum, nickel, gold, silver, and titanium.

Preferably, the material of the first metal connecting column and the second metal connecting column comprises one of Au, Ag, Cu, and Al.

Preferably, a material of the first metal bump and the second metal bump each comprises one of a tin solder, a silver solder, and a gold-tin alloy solder.

Preferably, the width of the first rewiring layer is greater than the width of the antenna structure, and the second metal connecting column is distributed on the second surface of the first rewiring layer at the periphery of the antenna structure.

Preferably, the second antenna metal layer has a window in an area aligned with the first antenna metal layer, to prevent the second antenna metal layer from blocking the first antenna metal layer.

The present disclosure further provides an antenna packaging method. The packaging method comprises steps of: 1) providing a first support substrate, and forming a separation layer on the first support substrate; 2) forming a first rewiring layer on the separation layer, where the first rewiring layer comprises a first surface connected to the separation layer and a second surface opposite to the first surface; 3) providing an antenna structure, where the antenna structure comprises a first packaging layer, a first antenna metal layer, a second rewiring layer, and a first metal bump, where the first antenna metal layer is disposed on a first surface of the first packaging layer, the second rewiring layer is disposed on a second surface of the first packaging layer, the first antenna metal layer is electrically connected to the second rewiring layer by a first metal connecting column passing through the first packaging layer, and the first metal bump is formed on the second rewiring layer; 4) bonding the second surface of the first rewiring layer to the first metal bump; 5) forming a second metal connecting column on the second surface of the first rewiring layer, where the second metal connecting column is not lower than a top surface of the antenna structure; 6) wrapping the antenna structure by using a second packaging layer, performing planarization treatment on a surface of the second packaging layer, to expose a top surface of the second metal connecting column from the second packaging layer; 7) forming a second antenna metal layer on the surface of the second packaging layer, where the second antenna metal layer is connected to the second metal connecting column; 8) stripping off the separation layer and removing the first support substrate, to expose the first surface of the first rewiring layer; 9) providing an antenna circuit chip, and bonding the antenna circuit chip to the first surface of the first rewiring layer; and 10) forming a second metal bump on the first surface of the first rewiring layer, to achieve electrical lead-out of the first rewiring layer.

Preferably, the first support substrate comprises one of a glass substrate, a metal substrate, a semiconductor substrate, a polymer substrate, and a ceramic substrate, the separation layer comprises one of an adhesive tape and a polymer layer, and the polymer layer is first coated on a surface of the first support substrate by using a spin-coating process, and then is cured by using an ultra-violet curing process or a thermal curing process.

Preferably, the step 2) of manufacturing the first rewiring layer comprises steps: 2-1) forming a dielectric layer on a surface of the separation layer by using a chemical vapor deposition process or a physical vapor deposition process, and etching the dielectric layer to pattern the dielectric layer; and 2-2) forming a metal layer on a surface of the patterned dielectric layer by using a chemical vapor deposition process, an evaporation process, a sputtering process, an electroplating process, or an electroless plating process, and etching the metal layer to pattern the metal wiring layer.

Further, the material of the dielectric layer comprises one or a combination of epoxy resin, silica gel, PI, PBO, BCB, silica, phosphosilicate glass, and fluorine-containing glass, and the material of the metal wiring layer comprises one or a combination of copper, aluminum, nickel, gold, silver, and titanium.

Preferably, the step 3) of providing the antenna structure comprises: 3-1) providing a second support substrate, and forming a stripping layer on the second support substrate; 3-2) forming a first antenna metal layer on the stripping layer, and forming a first metal connecting column on the first antenna metal layer; 3-3) wrapping the first antenna metal layer and the first metal connecting column by using a second packaging layer, and performing planarization treatment on the second packaging layer, to expose the first metal connecting column; 3-4) forming a second rewiring layer on the second packaging layer, and forming a first metal bump on the second rewiring layer; 3-5) separating the second support substrate from the second packaging layer based on the stripping layer, to expose the first antenna metal layer; and 3-6) performing cutting to form individual antenna structures.

Preferably, in the step 5), the second metal connecting column is manufactured by using wire bonding, where the wire bonding process comprises one of a thermal compression wire bonding process, an ultrasonic wire bonding process, and a thermal compression ultrasonic wire bonding process, and the material of the second metal connecting column comprises one of Au, Ag, Cu, and Al.

Preferably, in the step 6), a method for packaging the antenna chip by using the second packaging layer comprises one of compression molding, transfer molding, liquid seal molding, vacuum lamination, and spin-coating, and the material of the second packaging layer comprises one of PI, silica gel, and epoxy resin.

Preferably, in the step 8), a method for stripping off the separation layer and removing the first support substrate comprises one of mechanical stripping and chemical stripping.

Preferably, the first metal bump and the second metal bump each comprise one of a tin solder, a silver solder, and a gold-tin alloy solder.

Preferably, the width of the first rewiring layer is greater than the width of the antenna structure, and the second metal connecting column is distributed on the first rewiring layer at the periphery of the antenna structure.

Preferably, the second antenna metal layer has a window in an area aligned with the first antenna metal layer, to prevent the second antenna metal layer from blocking the first antenna metal layer.

Figure 1:
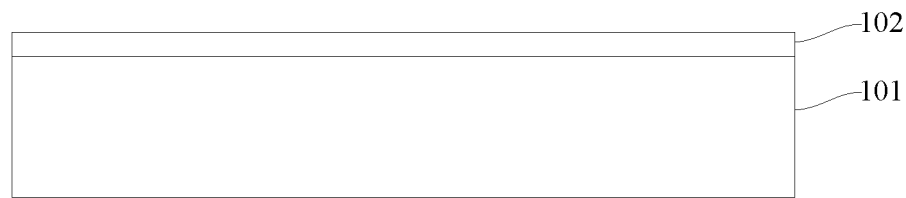
FIGS. 1 to. 18 are the cross sectional views of the antenna package in its sequential steps of fabrication according to one embodiment in the present disclosure.

| Descriptions of reference numerals | |
|---|---|
| 101 | First support substrate |
| 102 | Separation layer |
| 103 | Antenna circuit chip |
| 1031 | Connecting ports of the antenna circuit chip |
| 105 | First rewiring layer |
| 106 | Second metal connecting column |
| 107 | Second packaging layer |
| 108 | Second antenna metal layer |
| 109 | Second metal bump |
| 110 | Window |
| 201 | Second support substrate |
| 202 | Stripping layer |
| 203 | First antenna metal layer |
| 204 | First metal connecting column |
| 205 | First packaging layer |
| 206 | Second rewiring layer |
| 210 | Second metal wiring layer?? |
| 211 | Second via holes?? |
| 207 | First metal bump |

DETAILED DESCRIPTION OF THE PREFERRED EMBODIMENTS

Implementations of the present disclosure are described below by using particular and specific examples, and a person skilled in the art can easily understand other advantages and efficacy of the present disclosure from content disclosed in the specification. The present disclosure can further be implemented or applied by using other different specific implementations, details in the specification can also be based on different opinions and applications, and various modifications and changes can be made without departing the spirit of the present disclosure.

It should be noted that, figures provided in embodiments describe the basic idea of the present disclosure only in a schematic manner; only components related to the present disclosure are shown in the figures instead of drawing components based on the quantity, the shape, and the size of the components required during actual implementation; and the shape, the quantity, and the ratio of each component during actual implementation can be changed randomly, and the layout shape of the components may be more complex.

As shown in FIGS. 1 to 19, an antenna packaging fabrication method is provided. The fabrication method comprises the following steps.

As shown in FIG. 1, step 1), providing a first support substrate 101, and forming a separation layer 102 on the first support substrate 101.

In an example, the first support substrate 101 may be one of a glass substrate, a metal substrate, a semiconductor substrate, a polymer substrate, and a ceramic substrate. In this embodiment, the first support substrate 101 is a glass substrate. The glass substrate is low in cost, and it is easy to form the separation layer 102 on a surface of the glass substrate, and a difficulty of a subsequent stripping process can be lowered.

In an example, the separation layer 102 may be an adhesive tape or a polymer layer. The polymer layer is first coated on a surface of the first support substrate 101 by using a spin-coating process, and then is cured by using an ultra-violet curing process or a thermal curing process.

In this embodiment, the separation layer 102 is thermal curing adhesive. After the thermal curing adhesive is formed on the First support substrate 101 by using the spin-coating process, the thermal curing adhesive is cured by using the thermal curing process. The thermal curing adhesive has stable performance, and smooth surface, which facilitates manufacturing of a subsequent rewiring layer. In addition, in a subsequent stripping process, a stripping difficulty is low.

Figure 2:
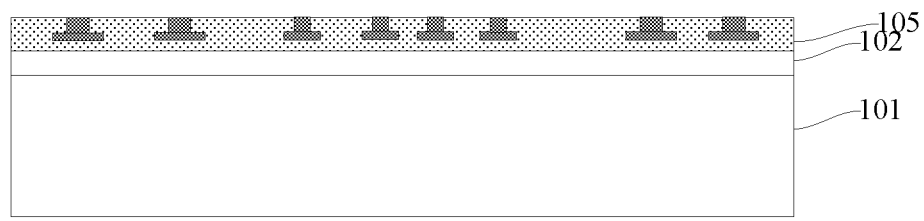

As shown in FIG. 2, step 2), forming a first rewiring layer 105 on the separation layer 102, wherein the first rewiring layer 105 comprises a first surface connected to the separation layer, and a second surface opposite to the first surface.

The step 2) of manufacturing the first rewiring layer 105 comprises the following steps.

Step 2-1), forming a dielectric layer on a surface of the separation layer 102 by using a chemical vapor deposition process or a physical vapor deposition process, and etch the dielectric layer to pattern the dielectric layer. The material of the dielectric layer may be one of epoxy resin, silica gel, polyimide (PI), Polybenzoxazole (PBO), Benzocyclobutene (BCB), silica, phosphosilicate glass, and fluorine-containing glass or a combination thereof.

Preferably, the material of the dielectric layer is polyimide (PI), to further reduce a process difficulty and process costs.

Step 2-2), forming a metal layer on a surface of the patterned dielectric layer by using a chemical vapor deposition process, an evaporation process, a sputtering process, an electroplating process, or an electroless plating process, and etching the metal layer to pattern the metal wiring layer. The material of the metal wiring layer may be one of copper, aluminum, nickel, gold, silver, and titanium or a combination thereof.

As shown in FIGS. 3 to 11, step 3), providing an antenna structure, where the antenna structure comprises a first packaging layer 205, a first antenna metal layer 203, a second rewiring layer 206, and a first metal bump 207, wherein the first antenna metal layer 203 is disposed on a first surface of the first packaging layer 205, the second rewiring layer 206 is disposed on a second surface of the first packaging layer 205, the first antenna metal layer 203 is electrically connected to the second rewiring layer 206 by a first metal connecting column 204 passing through the first packaging layer 205, and the first metal bump 207 is formed on the second rewiring layer 206.

The step 3) of providing the antenna structure comprises the following steps.

Figure 3:

As shown in FIG. 3, step 3-1), providing a second support substrate 201, and forming a stripping layer 202 on the second support substrate 201.

In an example, the second support substrate 201 may be one of a glass substrate, a metal substrate, a semiconductor substrate, a polymer substrate, and a ceramic substrate. In this embodiment, the second support substrate 201 is glass substrate. The glass substrate is low in cost, and it is easy to form the stripping layer 202 on a surface of the glass substrate, and a difficulty of a subsequent stripping process can be lowered.

In an example, the stripping layer 202 may be an adhesive tape or a polymer layer. The polymer layer is first coated on a surface of the second support substrate 201 by using a spin-coating process, and then is cured by using an ultra-violet curing process or a thermocuring process.

In this embodiment, the stripping layer 202 is thermocuring adhesive. After the thermocuring adhesive is formed on the second support substrate 201 by using the spin-coating process, the thermocuring adhesive is cured by using the thermocuring process. The thermocuring adhesive has stable performance, and smooth surface, which facilitates manufacturing of a subsequent rewiring layer. In addition, in a subsequent stripping process, a stripping difficulty is low.

Figure 4:
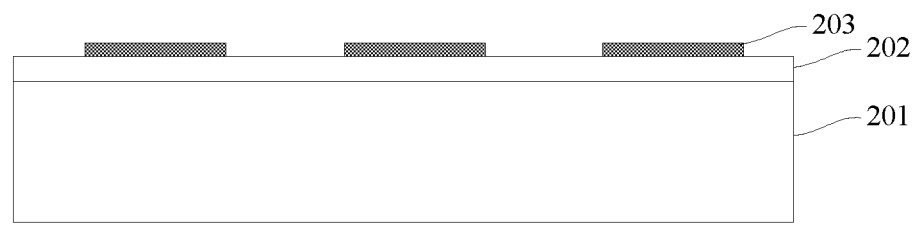
Figure 5:
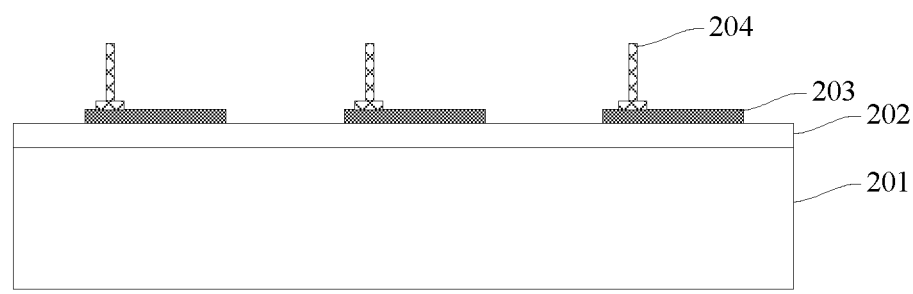

As shown in FIG. 4 and FIG. 5, step 3-2), forming a first antenna metal layer 203 on the stripping layer 202, and forming a first metal connecting column 204 on the first antenna metal layer 203.

Figure 6:
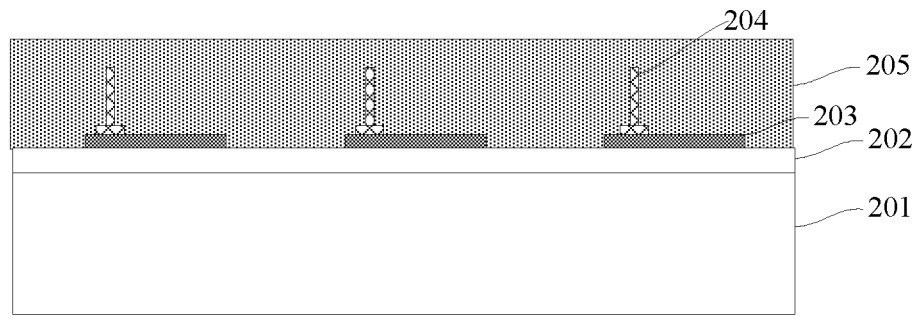
Figure 7:
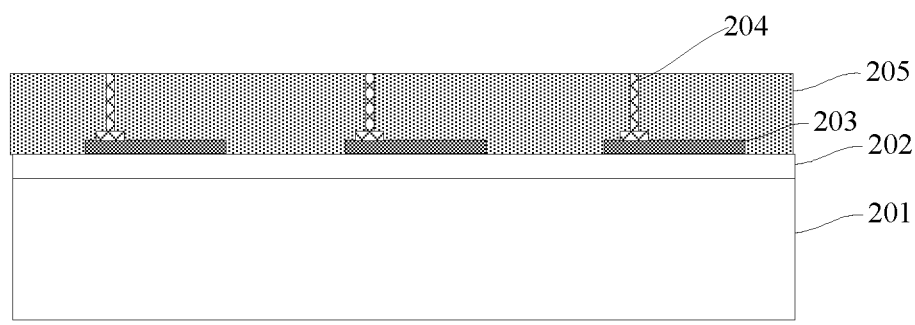

As shown in FIG. 6 and FIG. 7, step 3-3), wrapping the first antenna metal layer 203 and the first metal connecting column 204 by using a first packaging layer 205, then performing planarization treatment on the first packaging layer 205, to expose the first metal connecting column 204.

In an example, a method for wrapping the first antenna metal layer 203 and the first metal connecting column 204 with the first packaging layer 205 comprises one of compression molding, transfer molding, liquid seal molding, vacuum lamination, and spin-coating, and the material of the first packaging layer 205 may be one of PI, silica gel, and epoxy resin.

Figure 8:
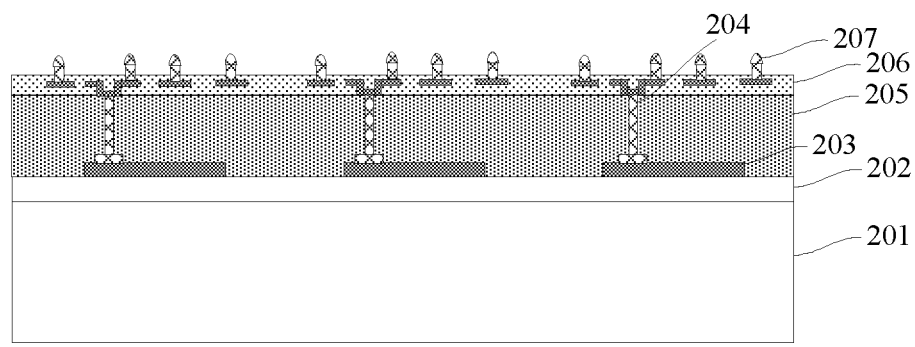

As shown in FIG. 8, step 3-4), forming a second rewiring layer 206 on the first packaging layer 205, and forming a first metal bump 207 on the second rewiring layer 206, wherein the first metal bump 207 passes through the patterned second dielectric layer and is connected to the patterned metal wiring layer. The first metal bump 207 may be one of a tin solder, a silver solder, and a gold-tin alloy solder.

Figure 9:
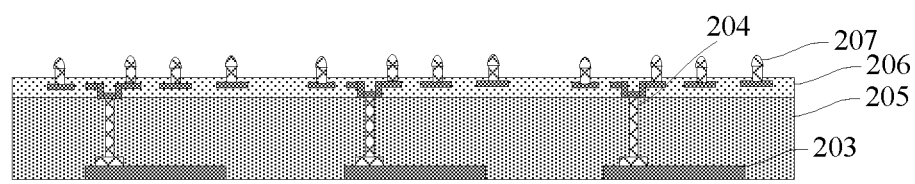

As shown in FIG. 9, step 3-5), separating the second support substrate 201 from the first packaging layer 205 based on the stripping layer 202, to expose the first antenna metal layer 203.

Figure 10:
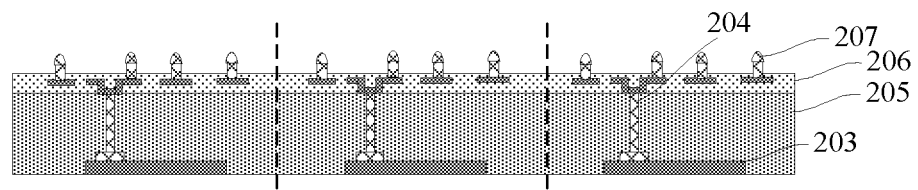
Figure 11:
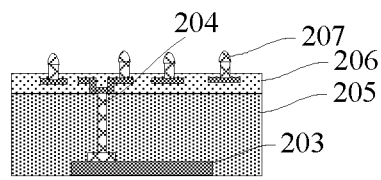

As shown in FIG. 10 and FIG. 11, step 3-6), performing cutting to form individual antenna structures.

Figure 12:
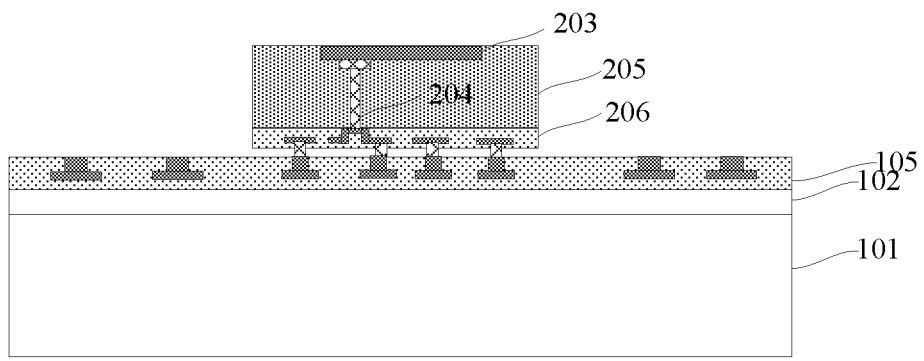

As shown in FIG. 12, step 4), bonding the second surface of the first rewiring layer 105 to the first metal bump 207.

For example, the second surface of the first rewiring layer 105 may be bonded to the first metal bump 207 by using a welding process.

Figure 13:
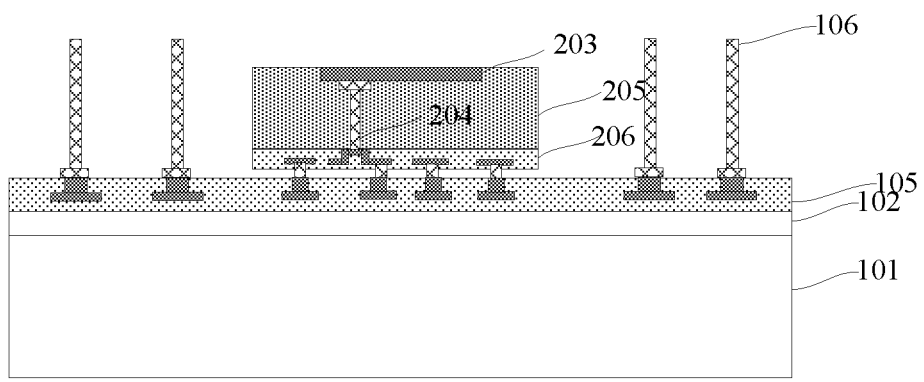

As shown in FIG. 13, step 5), forming a second metal connecting column 106 on the first surface of the first rewiring layer 105, wherein the second metal connecting column 106 is not lower than a top surface of the antenna structure.

The second metal connecting column 106 is manufactured by using a wire bonding process. The wire bonding process comprises one of a thermal compression wire bonding process, an ultrasonic wire bonding process, and a thermal compression ultrasonic wire bonding process. The material of the second metal connecting column 106 may be one of Au, Ag, Cu, and Al. For example, the second metal connecting column 106 is Al, and welding can be completed at a low temperature by using the ultrasonic wire bonding process, thereby greatly lowering a process temperature. In another example, the second metal connecting column 106 may be Au to obtain excellent electrical conductivity performance.

Preferably, the area of the first rewiring layer 105 connecting to the chip 103 is greater than the foot print area of the antenna structure, and the second metal connecting column 106 is distributed on the first rewiring layer 105 outside the antenna structure.

Figure 14:
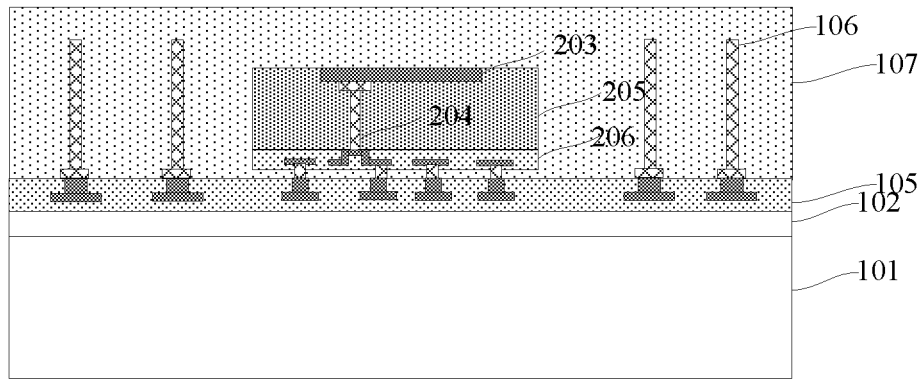
Figure 15:
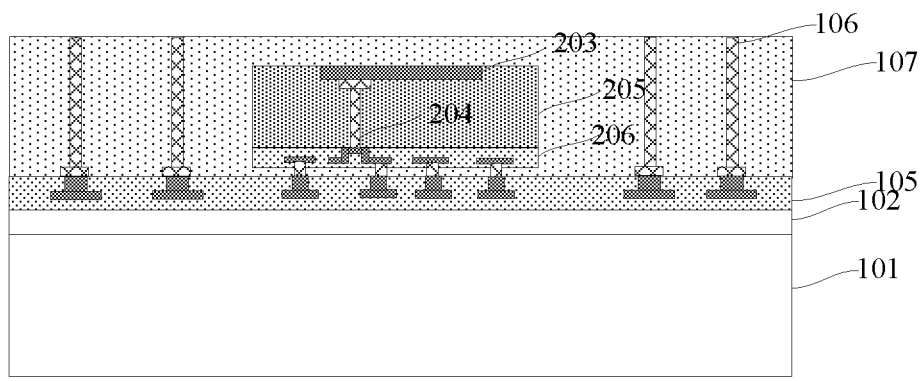

As shown in FIG. 14 and FIG. 15, step 6), depositing over the antenna structure and the second metal connecting column 106 with a second packaging layer 107, then performing planarization treatment on a surface of the second packaging layer 107 to expose a top surface of the second metal connecting column 106 from the second packaging layer 107.

In an example, a method for depositing the second packaging layer 107 over the antenna structure comprises one of compression molding, transfer molding, liquid seal molding, vacuum lamination, and spin-coating. The material of the second packaging layer 107 comprises one of PI, silica gel, and epoxy resin.

Figure 16:
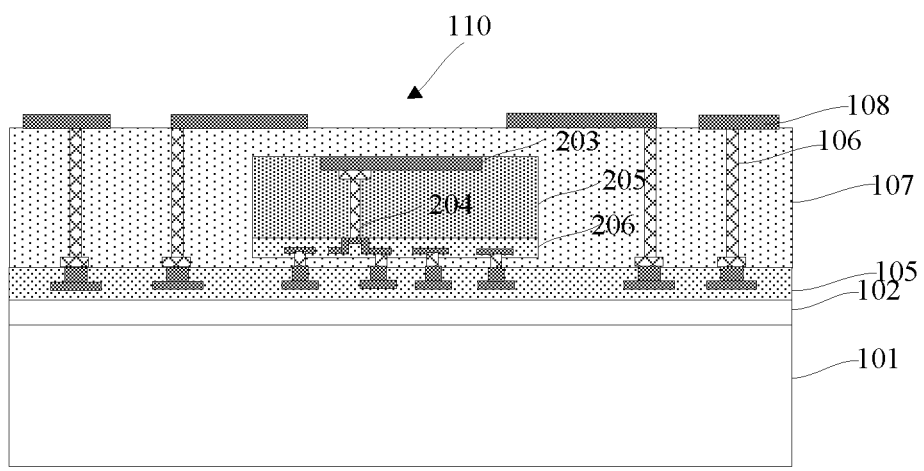

As shown in FIG. 16, step 7), forming a second antenna metal layer 108 on a surface of the second packaging layer 107, wherein the second antenna metal layer 108 is connected to the second metal connecting column 106.

In this embodiment, the second antenna metal layer 108 has a window 110 in an area aligned with the first antenna metal layer 203. The width of the window 110 is preferably greater than the width of the first antenna metal layer 203, to prevent the second antenna metal layer 108 from blocking the first antenna metal layer 203, thereby reducing mutual interference between multiple layers of antennas, and improving performance of the multiple layers of antennas.

Figure 17:
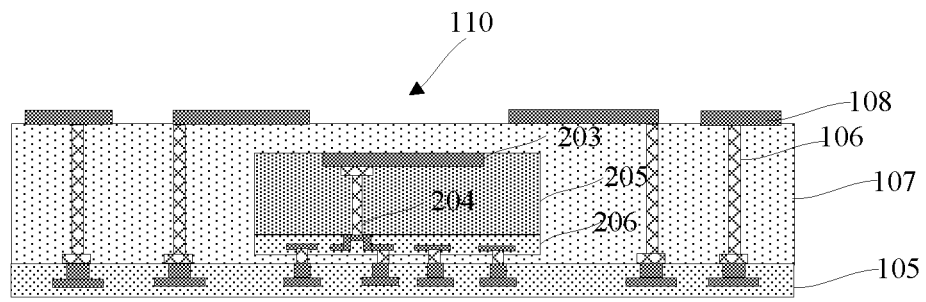

As shown in FIG. 17, step 8), stripping off the separation layer 102 and removing the second support substrate 107, to expose the first surface of the first rewiring layer 105.

In an example, the second packaging layer 107 and the first support substrate 101 may be separated by mechanical stripping, laser stripping, or chemical stripping (such as wet etching) according to material property of the separation layer 102.

Figure 18:
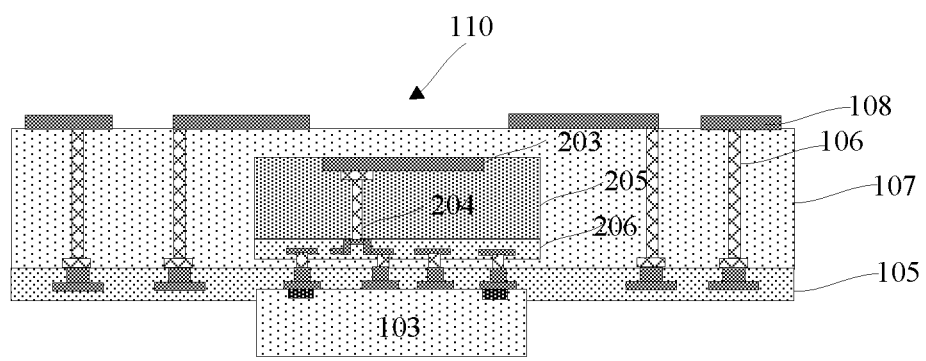

As shown in FIG. 18, step 9), providing an antenna circuit chip 103, and bonding the antenna circuit chip 103 to the first surface of the first rewiring layer 105. For example, the antenna circuit chip 103 may be bonded to the first surface of the first rewiring layer 105 by welding, so that the antenna circuit chip 103 is electrically connected to the first rewiring layer 105.

Figure 19:
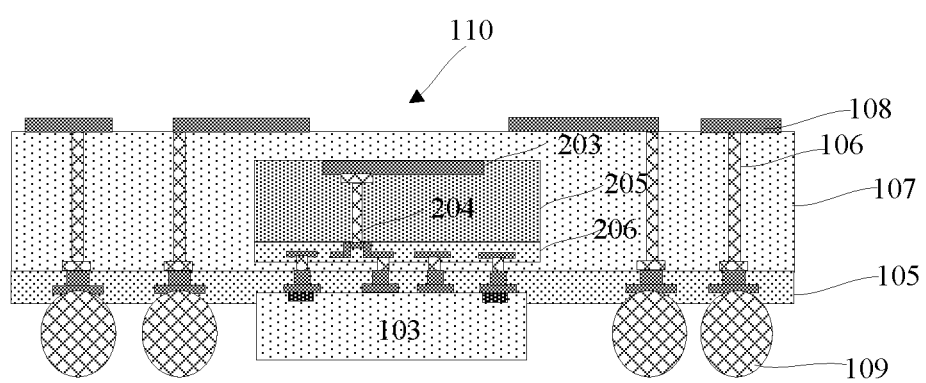
FIG. 19 shows the cross sectional view of the completed antenna package according to the present disclosure.

As shown in FIG. 19, step 10), forming a second metal bump 109 on the first surface of the first rewiring layer 105, to achieve electrical lead-out of the first rewiring layer 105.

As shown in FIG. 19, an antenna package structure is finally completed, with an antenna circuit chip 103, attached to the first rewiring layer 105, a second metal connecting column 106, a second packaging layer 107, a second antenna metal layer 108, and a second metal bump 109.

As shown in FIG. 19, the first rewiring layer 105 comprises a first surface and a second surface opposite to the first surface.

In an example, the first rewiring layer 105 comprises a patterned dielectric layer and a patterned metal wiring layer. The material of the dielectric layer may be one or a combination of epoxy resin, silica gel, PI, PBO, BCB, silica, phosphosilicate glass, and fluorine-containing glass. The material of the metal wiring layer may be one or a combination of copper, aluminum, nickel, gold, silver, and titanium.

As shown in FIG. 19, the completed antenna structure comprises a first packaging layer 205, a first antenna metal layer 203, a second rewiring layer 206, and a first metal bump 207, wherein the first antenna metal layer 203 is disposed on a first surface of the first packaging layer 205, the second rewiring layer 206 is disposed on a second surface of the first packaging layer 205, the first antenna metal layer 203 is electrically connected to the second rewiring layer 206 by a first metal connecting column 204 passing through the first packaging layer 205, the first metal bump 207 is formed on the second rewiring layer 206, and the first metal bump 207 is bonded to the first rewiring layer 105.

In an example, the second rewiring layer 206 comprises a patterned first dielectric layer xxx, a patterned metal wiring layer xxx, and a patterned second dielectric layer xxx. The first metal bump 207 passes through the patterned second dielectric layer and is connected to the patterned metal wiring layer. The material of the dielectric layer may be one or a combination of epoxy resin, silica gel, PI, PBO, BCB, silica, phosphosilicate glass, and fluorine-containing glass. The material of the metal wiring layer may be one or a combination of copper, aluminum, nickel, gold, silver, and titanium.

In an example, the material of the first metal connecting column 204 may be one of Au, Ag, Cu, and Al.

In an example, the first metal bump 207 may be one of a tin solder, a silver solder, and a gold-tin alloy solder.

In an example, the width of the first rewiring layer 105 is greater than the width of the antenna structure. The second metal connecting column 106 is distributed on the second surface of the first rewiring layer 105 at the periphery of the antenna structure.

In an example, the material of the first packaging layer 205 may be one of PI, silica gel, and epoxy resin.

As shown in FIG. 19, the second metal connecting column 106 is formed on the second surface of the first rewiring layer 105, and the second metal connecting column 106 is not lower than a top surface of the antenna structure.

As shown in FIG. 19, the second packaging layer 107 wraps the antenna structure and the second metal connecting column 106, and a top surface of the second metal connecting column 106 is exposed from the second packaging layer 107.

The material of the second packaging layer 107 may be one of PI, silica gel, and epoxy resin.

As shown in FIG. 19, the second antenna metal layer 108 is formed on a surface of the second packaging layer 107, and is connected to the second metal connecting column 106.

In an example, the second antenna metal layer 108 has a window 110 in an area aligned with the first antenna metal layer 203, to prevent the second antenna metal layer 108 from blocking the first antenna metal layer 203, thereby reducing mutual interference between multiple layers of antennas, and improving performance of the multiple layers of antennas.

The second metal bump 109 is formed on the first surface of the first rewiring layer 105, to achieve electrical lead-out of the first rewiring layer 105.

In an example, the second metal bump 109 may be one of a tin solder, a silver solder, and a gold-tin alloy solder.

As described above, the present disclosure has the following beneficial effects:

By using interconnecting multiple rewiring layers, multiple antenna metal layers are integrated, multiple antenna package structures can be directly interconnected vertically, thereby greatly improving antenna efficiency and performance, and achieving high integration.

By packaging antenna structure with a fan-out packaging method, a packaging volume is effectively reduced, so that the antenna package structure achieves high integration and better packaging performance, and has a wide application prospect in the semiconductor packaging field.

Therefore, the present disclosure effectively overcomes various disadvantages in the prior art and has high industrial utilization value.

The foregoing embodiments are merely intended to exemplarily describe the principles and efficacy of the present disclosure and are not intended to limit the present disclosure. A person skilled in the art can make modifications or changes to the foregoing embodiments without departing from the spirit and scope of the present disclosure. Therefore, any equivalent modifications or changes completed by a person of common knowledge in the art without departing from the spirit and technical thoughts disclosed in the present disclosure shall still fall within the scope of the claims of the present disclosure.

The invention claimed is:

1. An antenna packaging method, comprising steps:
   1) providing a first support substrate, and forming a separation layer on the first support substrate;
   2) forming a first rewiring layer on the separation layer, wherein the first rewiring layer comprises a first surface connected to the separation layer and a second surface opposite to the first surface;
   3) providing an antenna structure, wherein the antenna structure comprises:
   a first antenna metal layer;
   a first packaging layer disposed on the first antenna metal layer, wherein the first packaging layer is polished on a top surface;
   a second rewiring layer, disposed on the polished surface of the first packaging layer; and
   a first metal bump, formed on the second rewiring layer;
   4) bonding the second surface of the first rewiring layer to the first metal bump to attach the antenna structure to the first rewiring layer;
   5) forming a second metal connecting column on the second surface of the first rewiring layer;
   6) depositing a second packaging layer over the antenna structure and the second metal connecting column, performing planarization treatment on a top surface of the second packaging layer, to expose a top surface of the second metal connecting column from the second packaging layer, wherein the top surface of the second metal connecting column is not lower than a top surface of the antenna structure;
   7) forming a second antenna metal layer on a top surface of the second packaging layer, wherein the second antenna metal layer is connected to the second metal connecting column;
   8) stripping off the separation layer from the first surface of the first rewiring layer and removing the first support substrate, to expose the first surface of the first rewiring layer;
   9) providing an antenna circuit chip with at least two output ports, bonding the antenna circuit chip to the first surface of the first rewiring layer and aligning the two output ports to a first metal layer of the first rewiring layer; and
   10) forming a second metal bump at the first surface of the first rewiring layer, to achieve electrical lead-out of the first rewiring layer.

2. The antenna packaging method according to claim 1, wherein the first support substrate comprises one of a glass substrate, a metal substrate, a semiconductor substrate, a polymer substrate, and a ceramic substrate, the separation layer comprises one of an adhesive tape and a polymer layer, and the polymer layer is first coated on a surface of the first support substrate by using a spin-coating process, and then is cured by using an ultra-violet curing process or a thermal curing process.

3. The antenna packaging method according to claim 1, wherein manufacturing the first rewiring layer in step 2) comprises:
   2-1) forming a first dielectric layer on a surface of the separation layer by using a chemical vapor deposition process or a physical vapor deposition process, and patterning the first dielectric layer to form recesses; and
   2-2) patterning a first metal wiring layer on a surface of the first dielectric layer by using a chemical vapor deposition process, an evaporation process, a sputtering process, an electroplating process, or an electroless plating process, followed by etching.

4. The antenna packaging method according to claim 3, wherein a material of the first dielectric layer comprises one or a combination of epoxy resin, silica gel, polyimide (PI), PBO, BCB, silica, phosphosilicate glass, and fluorine-containing glass, and a material of the first metal wiring layer comprises one or a combination of copper, aluminum, nickel, gold, silver, and titanium.

5. The antenna packaging method according to claim 1, wherein the step 3) of providing the antenna structure comprises:
   3-1) providing a second support substrate, and forming a stripping layer on the second support substrate;
   3-2) forming the first antenna metal layer on the stripping layer, and forming a first metal connecting column on the first antenna metal layer, followed by disposing the first packaging layer on the first antenna metal layer and the first metal connecting column, wherein a top surface of the first metal connecting column is exposed from the polished first packaging layer;
   3-3) separating the second support substrate from the second packaging layer based on the stripping layer, to expose the first antenna metal layer; and
   3-4) performing die cutting to form individual antenna structures.

6. The antenna packaging method according to claim 1, wherein in the step 5), the second metal connecting column is fabricated by wire bonding, wherein the wire bonding comprises one of a thermal compression wire bonding process, an ultrasonic wire bonding process, and a thermal compression ultrasonic wire bonding process, and wherein a material of the second metal connecting column comprises one of Au, Ag, Cu, and Al.

7. The antenna packaging method according to claim 1, wherein in the step 6), depositing the second packaging layer comprises one of compression molding, transfer molding, liquid seal molding, vacuum lamination, and spin-coating, and a material of the second packaging layer comprises one of PI, silica gel, and epoxy resin.

8. The antenna packaging method according to claim 1, wherein in the step 8), stripping off the separation layer and the first support substrate comprises one of mechanical stripping and chemical stripping.

9. The antenna packaging method according to claim 1, wherein the first metal bump and the second metal bump each comprises one of a tin solder, a silver solder, and a gold-tin alloy solder.

10. The antenna packaging method according to claim 1, wherein a footprint area of the first rewiring layer under the antenna structure is greater than a footprint area of the antenna structure, and wherein the second metal connecting column is distributed on the first rewiring layer at the periphery of the antenna structure.

11. The antenna packaging method according to claim 1, wherein the second antenna metal layer has a window in an area aligned with the first antenna metal layer, to prevent the second antenna metal layer from blocking the first antenna metal layer.

* * * * *